United States Patent [19]
Henkelmann

[11] Patent Number: 5,489,841
[45] Date of Patent: Feb. 6, 1996

[54] MULTIMETER FOR MEASURING VARIOUS MEASURABLE VARIABLES

[75] Inventor: Dieter Henkelmann, Nürnberg, Germany

[73] Assignee: ABB Patent GmbH, Mannheim, Germany

[21] Appl. No.: 449,466

[22] Filed: May 24, 1995

Related U.S. Application Data

[60] Continuation of Ser. No. 37,975, Mar. 25, 1993, abandoned, which is a division of Ser. No. 754,460, Sep. 3, 1991, Pat. No. 5,256,961.

[30] Foreign Application Priority Data

Sep. 1, 1990 [DE] Germany .................... 40 27 804.2

[51] Int. Cl.⁶ .................................................. G01R 15/08
[52] U.S. Cl. ........................................................ 324/115
[58] Field of Search ...................... 324/99 D, 103 R, 324/114, 115–116, 120, 123, 133; 340/540, 686, 687, 661, 657

[56] References Cited

U.S. PATENT DOCUMENTS

| | | | |
|---|---|---|---|
| 4,075,559 | 2/1978 | Chaprnka et al. | 324/115 |
| 4,321,530 | 3/1982 | Kelly et al. | 324/115 |
| 4,520,310 | 5/1985 | Kelly et al. | 324/115 |
| 4,604,569 | 8/1986 | Tedd et al. | 324/115 |
| 4,789,824 | 12/1988 | Henkelmann | 324/115 |
| 5,166,599 | 11/1992 | Hochreuther et al. | 324/115 |
| 5,278,493 | 1/1994 | Henkelmann | 324/115 |

*Primary Examiner*—Vinh P. Nguyen
*Attorney, Agent, or Firm*—Herbert L. Lerner; Laurence A. Greenberg

[57] ABSTRACT

A method for measuring various measurable variables with a multimeter includes specifying one of a plurality of measurable variables to be determined through a position of a measurement range switch and/or through a selection between various input connections respectively assigned to the measurable variables. Input circuits are assigned to respective measurable variables. A preliminary test is performed for at least one of the measurable variables to check if an input circuit is suitable for picking up an applied test signal, before an actual main measurement is carried out. A given input circuit is enabled for picking up the test signal only if the preliminary test has shown that the test signal is suitable for the given input circuit. An error signal is issued if a test signal being unsuitable for the given input circuit ensues. A multimeter for measuring various measurable variables includes a measurement range switch and/or various input connections for specifying a measurable variable to be picked up. Input circuits are each associated with a respective one of the measurable variables. At least one input circuit switch in at least one of the input circuits is open in a position of repose and is switched on for measurement only if a test of the test signal has shown that one of the input circuits to be switched on is suitable for picking up a test signal from a test object.

37 Claims, 4 Drawing Sheets

MULTIMETER FOR MEASURING VARIOUS MEASURABLE VARIABLES

This application is a continuation of application Ser. No. 08/037,975, filed Mar. 25, 1993, now abandoned; which was a divisional of application Ser. No. 07/754,460, filed Sep. 3, 1991, now U.S. Pat. No. 5,256,961.

The invention relates to a measuring method for a multimeter being suitable for measuring various measurable variables, in which a specification of the measurable variable to be determined is effected through a measurement range switch and/or through a selection between various input connections, each being assigned to a certain measurable variable, and wherein an input circuit specific to each measurable variable is provided for measuring. The invention also relates to a multimeter for performing the method, in which the specification of the measurable variable to be picked up is effected by means of a measurement range switch and/or various input connections, and different input circuits are associated with the various measurable variables.

Measuring instruments, particularly multimeters, are typical tools today for both electricians and laboratory technicians. On the other hand, they are relatively expensive tools, which one would like to see protected as much as possible from destruction. There is a virtually universal danger of incorrectly operating and therefore destroying a multimeter, which is intended to measure very different measurable variables.

A repeated occurrence is that a measuring instrument is set for measuring current and then applied to mains voltage by mistake. In that case, at least the input circuit of the multimeter which is constructed to measure current is destroyed along with its shunts. If the mains fuse does not break the circuit fast enough, then the user can also be endangered, because as a rule the appliance fuse provided in the multimeter is inadequate to disconnect the multimeter from a high-energy voltage source. An arc that may be produced when the circuit opens spans the appliance fuse, and the course of damage that develops is often unpredictable.

Naturally, an attempt has been made to keep the dangers of incorrect operation within limits by providing additional safety features. The protection circuits which are used work with passive and active switches and relay switches, controlled semiconductor switches, transistors and thyristors, and safety fuses of a special construction. Despite the sometimes very high expense, previous techniques are still by no means always capable of reliably shutting off high-power voltage sources inside the small space available in modern multimeters in case of an error. The high currents represent a particular problem, because in the case of error they flow through the input circuit of the measuring instrument and then have to be turned off to protect the input circuit.

It is accordingly an object of-the invention to provide a method for measuring various measurable variables and a multimeter for performing the method, which overcome the hereinafore-mentioned disadvantages of the heretofore-known methods and devices of this general type and with which it is possible in principle to keep unsuitable measurable variables that threaten certain input circuits of the measurement instrument away from these input circuits, so that it is unnecessary to turn off the input circuit, and no damage can come to the multimeter even if it is improperly operated.

With the foregoing and other objects in view there is provided, in accordance with the invention, a method for measuring various measurable variables with a multimeter, which comprises specifying one of a plurality of measurable variables to be determined through a position of a measurement range switch and/or through a selection between various input connections respectively assigned to the measurable variables; assigning an input circuit to each respective measurable variable; performing a preliminary test for at least one of the measurable variables to check if an input circuit is suitable for picking up an applied test signal, before an actual main measurement is carried out; enabling a given input circuit for picking up the test signal only if the preliminary test has shown that the test signal is suitable for the given input circuit; and issuing an error signal if a test signal being unsuitable for the given input circuit ensues.

The attainment of this object affords preventive protection to the multimeter in such a way that if a measurable variable is incorrectly specified, the input circuit associated with this measurable variable, if it is an input circuit at risk, or in other words an input circuit for measuring a current, is not even connected to the dangerous test signal in the first place, so that the critical shutoff that is typically provided in non-protective circuits becomes unnecessary.

Due to its high input resistance, the input circuit for voltage measurement is not at risk. Any arbitrary measurable variable can be connected to that input circuit without putting the measuring instrument at risk as a result.

Therefore, in accordance with another mode of the invention, there is provided a method which comprises connecting an input circuit serving to measure voltage to a test object at the beginning of a measurement, regardless of the specified measurable variable. Through the use of an ensuing voltage measurement, it can then be ascertained if the object being measured is producing a voltage. If a voltage measurement is to be effected in accordance with the specified measurable variable, then the course of measurement can already be broken off at that point. Even if the measurable variable is intended to be a resistance, this first voltage measurement is already sufficient to decide whether or not the input circuit for resistance measurement can be switched on. By comparison, if a current is the specified measurable variable, two successive voltage measurements have to be performed as will be explained below, before a decision can be made to release the input circuit for the current measurement. If a result of the voltage measurements provided for testing purposes is that the test signal which is put out by the test object to be measured cannot or should not be measured with the specified input circuit, then the multimeter generates an error signal. However, if the correct input circuit has been selected, then it is enabled, so that measurement of the measurable variable to be tested can then ensue.

If a voltage range is selected when a multimeter is being used, particularly a range for high voltages, there is no danger that the multimeter will be destroyed when an incorrect test signal is applied. The testing of the test signal that receives the actual measurement can thus be limited to input circuits that are at risk, that is preferably input circuits for measuring current and resistance.

In accordance with a further mode of the invention, there is provided a method which comprises making the enabling of an input circuit for resistance measurement dependent on whether a voltage was ascertained in the preceding voltage measurement, or whether that voltage was so high that it can lead to adulteration of the outcome of measurement or risk to the measuring circuit.

In accordance with an added mode of the invention, there is provided a method which comprises enabling an input circuit suitable for measuring current whenever a short-circuit current for the current measurement range being set and ascertained from the idling voltage and the internal resistance of the test object to be measured, does not represent any risk. The idling voltage of the test object to be measured can already be measured in its first test for the presence of a voltage. The internal resistance of the test object to be measured can be ascertained by the voltage drop method, in which a load on the object to measured is effected after the idling voltage is measured, by means of a load resistor, and the reduced voltage then applied to the test object to be measured is likewise measured. The internal resistance of the test object to be measured can then be calculated from the idling voltage, the load voltage, and the load resistance.

Enabling of an input circuit at risk should be cancelled immediately as soon as the test signal disappears, because in the normal situation it can be assumed that a new test object to be measured is then connected to the measuring instrument, and this new object must also be subjected to a new preliminary test. The disappearance of the test signal or the sudden increase in the input resistance upon separation of the measuring conductor from the test object to be measured can serve as a criterion for initiating a new preliminary test.

However, in special cases, for instance if a test object to be measured must be monitored and the test signal thereof can return to zero, or if a relatively high number of individual resistors are to be tested, for instance, it should be possible to prevent the return to the test procedure, in order to avoid a loss of time for the preliminary test, which can sometimes occur in fairly slow measuring instruments.

With the objects of the invention in view, there is also provided a multimeter for measuring various measurable variables, comprising a measurement range switch and/or various input connections for specifying a measurable variable to be picked up, input circuits each being associated with a respective one of the measurable variables, and at least one input circuit switch in at least one of the input circuits being open in a position of repose and being switched on for measurement only if a test of the test signal has shown that one of the input circuits to be switched on is suitable for picking up a test signal form a test object.

In accordance with another feature of the invention, the preliminary test of the test signal is done with the same measuring system that is used for the actual main measurement. Upon a change from the preliminary test to the main measurement, the input circuit switch must then be capable of connecting various input circuits to the measuring system. Alternatively, it is possible to perform the preliminary test of the test signal with its own testing system, which picks up the input signal immediately downstream of the input connections and can thus remain connected to the input connections at all times, regardless of any particular input circuit that may be turned on. The testing system can be relatively simple in structure, since the requisite measurement accuracy is quite low, while on the other hand the number of switches required for the input circuits can be reduced.

In the test as to whether the specified input circuit is suitable for the test signal applied, two different things must be tested. First, it must be ascertained whether or not the measurable variable specified by the measurement range switch fits the specified input circuit; the input circuit can be specified either by a selection between different input connections or by means of an input circuit switch. However, even if the associated operation of the multimeter was correct, the multimeter could still be supplied through its measuring conductors with a test signal that is unsuitable for the intended input circuit, so that in this respect a second test must be performed. The enabling of the input signal for the test signal being applied depends on the second test.

In accordance with a further feature of the invention, one possible way of dispensing with the first part of the test is to couple an electrically and/or mechanically acting shutoff device to the measurement range switch in such a way that electrical contact is made possible for only that input circuit having a measurable variable which matches the measurable variable set with the measurement range switch. The preliminary test can then be restricted to the second portion of the test.

In accordance with an added feature of the invention, the control of the input circuit switches is suitably effected by means of an input circuit control unit, which in turn is activated as a function of a control circuit. The control circuit gives an activation command after testing of the test signal by a test circuit.

The error signal that is generated if the test signal is not suitable for the intended input circuit can be either reported to the operator, for instance by means of an acoustical signal generator, and as a result can cause the user to switch over the input circuit, or it may effect an automatic switchover of the input circuit switch to a suitable input circuit.

In accordance with an additional feature of the invention, there is provided a load resistor which can bypass the associated input circuit with a series-connected load circuit switch in order to determine the internal resistance of the test object to be measured at certain measurable variables, in particular before a current measurement. Control of the load circuit switch is effected with the aid of the control circuit in such a way that the voltage drop can be ascertained by means of the test circuit, and the internal resistance can be calculated from that.

In accordance with yet another feature of the invention, in order to prevent the measurement range switch from being mistakenly switched over to another measurable variable during a measurement, it is practical to lock the measurement range switch with the aid of the control circuit, optionally through a magnetic positioner, until such time as a test signal originating in the test object to be measured is detected by the test circuit. The locking can be constructed in such a way that only the switchover to another measurable variable, but not to another measuring range of the same measurable variable, is blocked. Thus a switchover to some other measurable variable is possible only if all of the input circuits are without current.

In accordance with a concomitant feature of the invention, since relatively high demands must be placed on the performance of the control circuit, it is suitable to construct it with the aid of one or more microprocessors, which can then take other control and computation functions into account as needed. It is also possible to integrate the test circuit and the input circuit control unit into the control circuits, and to perform programming or input of certain instructions through a manual control element.

Other features which are considered as characteristic for the invention are set forth in the appended claims.

Although the invention is illustrated and described herein as embodied in a method for measuring various measurable variables and a multimeter for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
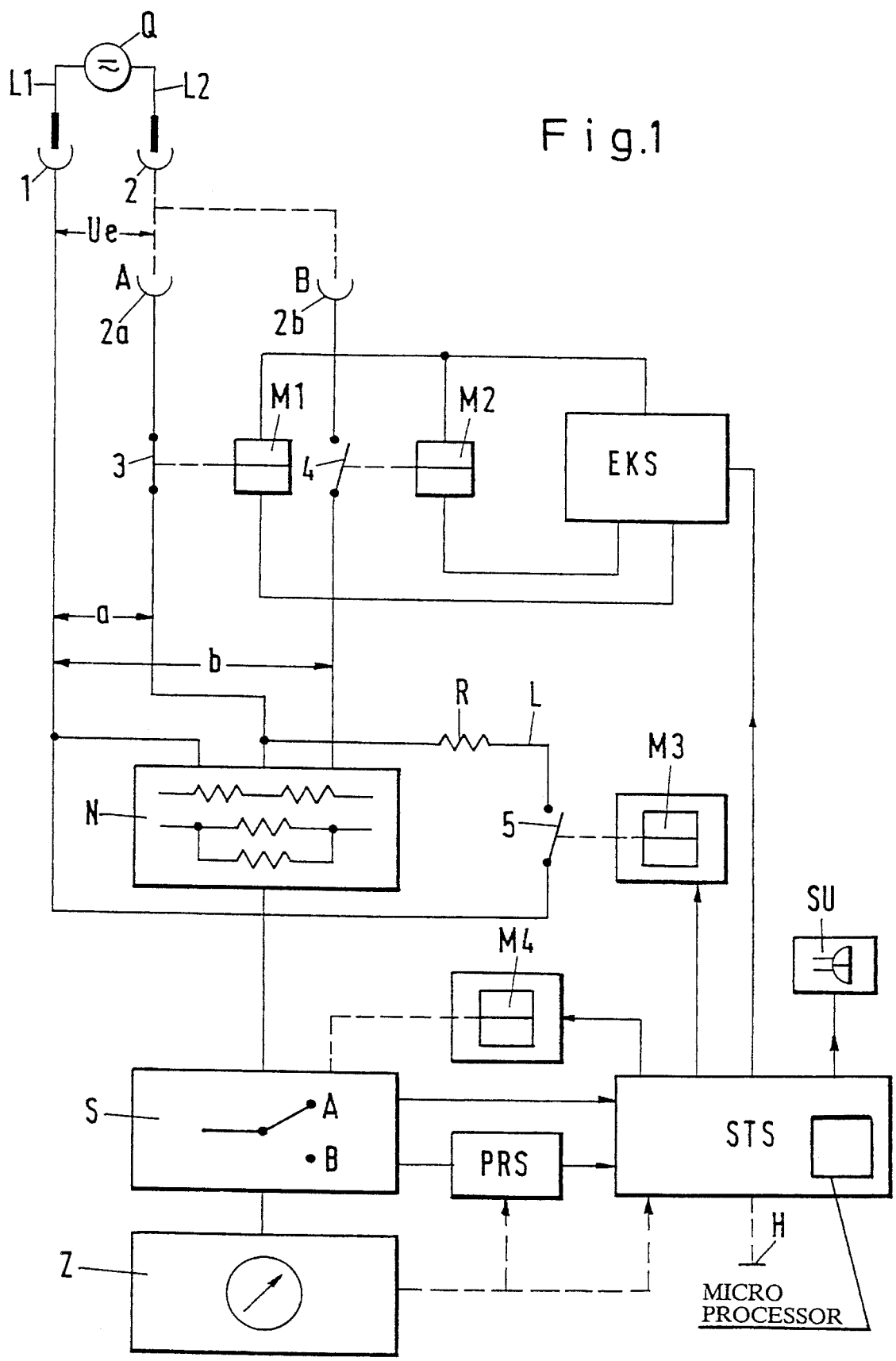
FIG. 1 is a schematic and block circuit diagram of a multimeter for preliminary testing of a test signal.

Referring now to the figures of the drawing in detail and first, particularly, to FIG. 1 thereof, it is seen that a possibility exists in principle of specifying a measurable variable A or B to be ascertained by means of a measurement range switch S or by means of a plurality of input connections or terminals 2a, 2b. If there were a plurality of input connections 2a, 2b, upon a change of measurable variables it would be necessary to plug at least one measuring conductor L1, L2 into a transposed plug, which is undesirable in a convenient instrument. A broken line which indicates this possibility and connects the input connections 2a, 2b to one another can thus be viewed as a fixed connection for the purposes of the description given below.

Accordingly, the multimeter has the input connections 1 and 2, by means of which a test object Q to be measured is connected through measuring conductors L1, L2. What is to be measured is a test signal Ue put out by or generated at the test object to be measured. Depending on the type of measurable variable, the test signal Ue reaches a corresponding measuring range network N, which is switched over with the aid of a measurement range switch S, through an input circuit a, which is associated with the measurable variable A, or through an input circuit b, which is associated with the measurable variable B. A measuring system Z downstream of the measurement range switch S serves to evaluate and display the test signal Ue.

The other components of the block circuit diagram serve to provide a testing phase that precedes the actual measurement. A control circuit STS operates through an input circuit control unit EKS to assure that in the test phase, regardless of the specified position of the measurement range switch S, the input circuit a, b serving to measure voltage, which may, for example, be the input circuit a, is switched on, while all of the other input circuits remain open. A test circuit PRS then compares the position of the measurement range switch S with the test signal Ue that is picked up, and by means of suitable criteria decodes information as to whether or not the input circuit a should be re-opened and in its place another input circuit, such as b, corresponding to the position of the measurement range switch, should be turned on. If a voltage was specified as the measurable variable at the measurement range switch S, then no switchover takes place, and a first input circuit switch 3 located in the input circuit a remains on.

For instance, if the input circuit b is constructed for measuring a resistance and if a resistance is to be measured, then on the condition that a resistor was also specified by the measurement range switch, for instance as the measurable variable B, if the input signal Ue were absent, the test circuit PRS would first trip the opening of the first input circuit switch 3 and then the closure of a second input circuit switch 4, through the control circuit STS and the input circuit control unit EKS. However, if the test circuit PRS determines that an objectionable voltage is present as a test signal Ue at the input connections 1, 2, which would lead to a risk or at least to a falsification of the outcome of measurement, then the first input circuit switch 3 remains closed and the second input circuit switch 4 remains open, and an acoustical signal generator, for instance a buzzer SU, is activated to output an error signal. The user is thereby told to put the measurement range switch S in the switching position corresponding to the test signal.

The control circuit STS has at least one microprocessor and a manual control element H is connected to the control circuit STS for programming or inputting certain instructions. The microprocessor performs further control and computation functions of different types and preferably also performs tasks of the test circuit PRS and of the input circuit control unit EKS.

Figure 7:
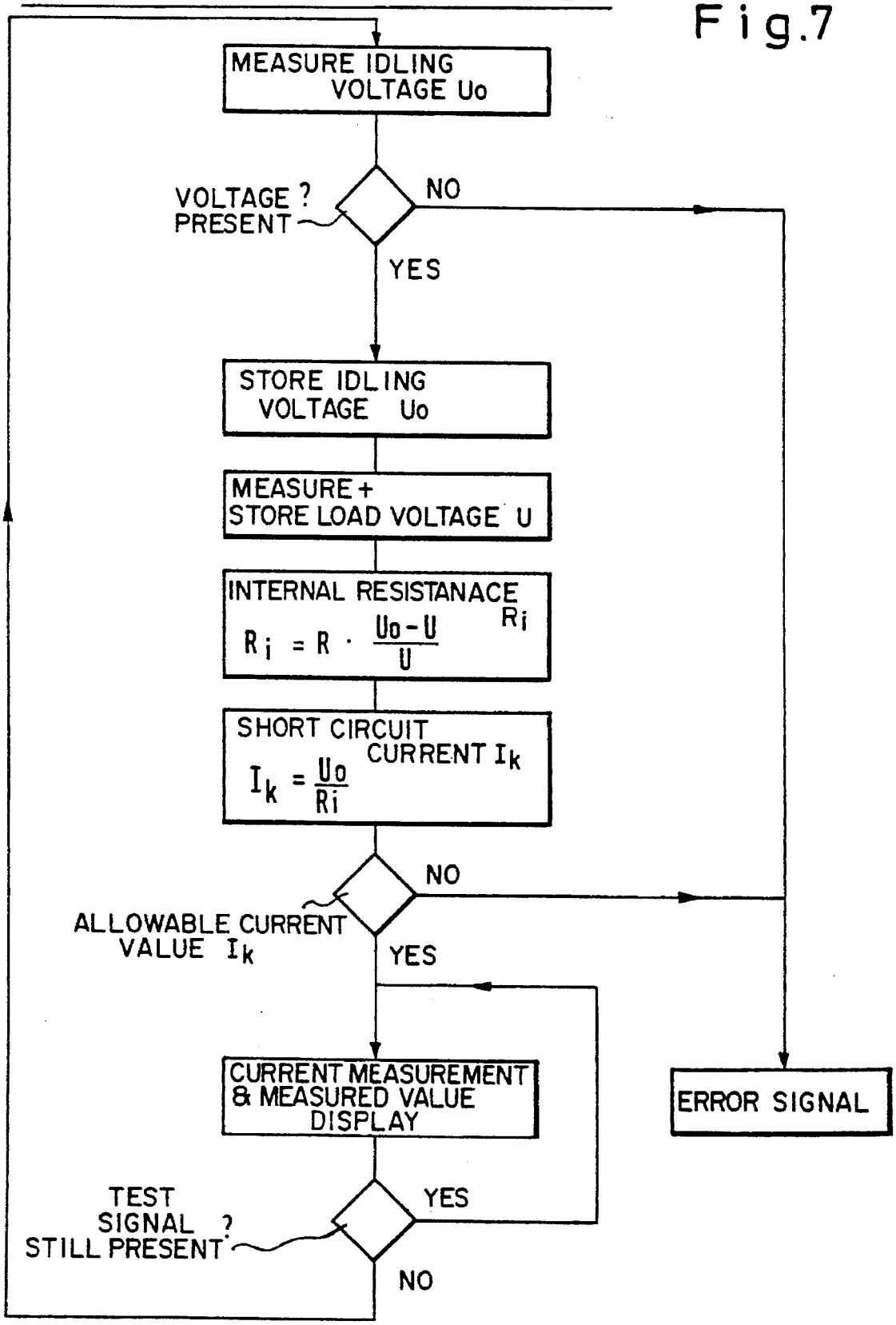
FIG. 7 is a flow chart for a preliminary test in the event of current measurement.

On the assumption that a current is specified as the measurable variable B through the measurement range switch S, then the measuring process proceeds as shown in the flow chart of FIG. 7. After initialization or in other words switching-on of a multimeter, the measuring process proceeds automatically. First, the control circuit STS again assures that only the input circuit switch 3 is switched on, and thus enables the input circuit a for the voltage measurement represented by the measurable variable A. If the test circuit PRS should be unable to ascertain any voltage, then it imparts this finding to the control circuit STS, which uses the acoustical signal generator SU to provide an error signal, that informs the user that the test object Q which is connected is not suitable for current measurement. However, if the test object Q does put out a voltage, this voltage is stored in memory as an idling voltage Uo, and a load circuit L having a resistor R is connected to the test object Q by means of the control circuit STS through a magnetic switch M3 and a load circuit switch 5. A load voltage U which is then reduced by the load as compared with the idling voltage Uo, is likewise measured and stored in memory. With the aid of the two measured voltage values Uo, U and the known value R of the load circuit L, the test circuit PRS can calculate an internal resistance Ri, and with the aid of it and the idling voltage Uo, a short-circuit current Ik. The test circuit PRS then ascertains whether the detected current value can still be considered permissible, or whether a voltage source, for instance, rather than a current source as intended, has mistakenly been connected as the test object Q to the input connection 1, 2. If the current value should exceed the allowable range, then the test circuit passes this information on to the control circuit which in turn trips an error signal through the use of the signal generator SU. In contrast, if the short-circuit current Ik is in an allowable range for measuring current with the multimeter, then the control circuit STS activates the input circuit control unit EKS, and that unit assures that first the input circuit a is interrupted by opening the input circuit switch 3, and then the input circuit b is enabled for current measurement by closure of the second input circuit switch 4. The intended current measurement then follows. This is continued until such time as the input circuit opens, for instance because the test object Q has been removed so that another test object can be tested.

In order to avert measurement errors occurring from a mistaken switchover of the measurement range switch S to some other measurable variable a, b, the control circuit STS assures locking of the measurement range switch S through a magnetic positioner M4, and this locking is maintained until such time as the test signal disappears. The locking naturally blocks only a switchover between different measurable variables, but not between different measuring ranges of the same measurable variable.

Multimeters with electronic equipment require a battery for their power supply, and its capacity must be used sparingly, so that the time intervals between battery changes will be as long as possible. It is accordingly wise to avoid components having increased current consumption as much as possible. While at present semiconductors require only a very low supply current, this cannot automatically be said of magnetic switches. This is true even if bistable magnetic switches are used, which require only a pulse and not a holding current to be switched over. It would accordingly be advantageous to replace the magnetic switches used in the circuit of FIG. 1 with manually actuated switches, because in that case no significant sacrifice in terms of ease of use would have to be made.

In the testing of the test signal that precedes the actual measurement according to the invention, a distinction must be made between two types of improper operation. First, in conventional multimeters it is possible to set the measurement range switch to a measurable variable that does not match the input circuit. However, even if it is assured that the measurable variable is specified correctly, the possibility remains of applying a non-matching test signal to the input of the multimeter, for instance by connecting the wrong test object to it.

The circuit of FIG. 1 does not distinguish between these two variant errors, because the testing it performs decides on principle whether or not an applied test signal is suitable for measurement by the specified input circuit, and only then switches on that circuit for the actual measurement, at least if it is an input circuit at risk. In this case, the switchover of the input circuit switches 4, 5 is performed automatically with the aid of the magnetic switches M1, M2, but it can also be performed by hand, once the test circuit PRS has enabled a certain input circuit, for instance by means of a signal that the user can recognize.

If the test circuit PRS makes use of the test signal processing performed by the measuring range network N, the measurement range switch S and the measuring system Z in checking the test signal, then it should be connected as shown in FIG. 1. However, the test circuit PRS could also be equipped with an autonomous measuring system, and in that case it could pick up the test signal directly downstream of the input connections 1, 2, as represented by an amplifier V in FIG. 2.

Figure 2:
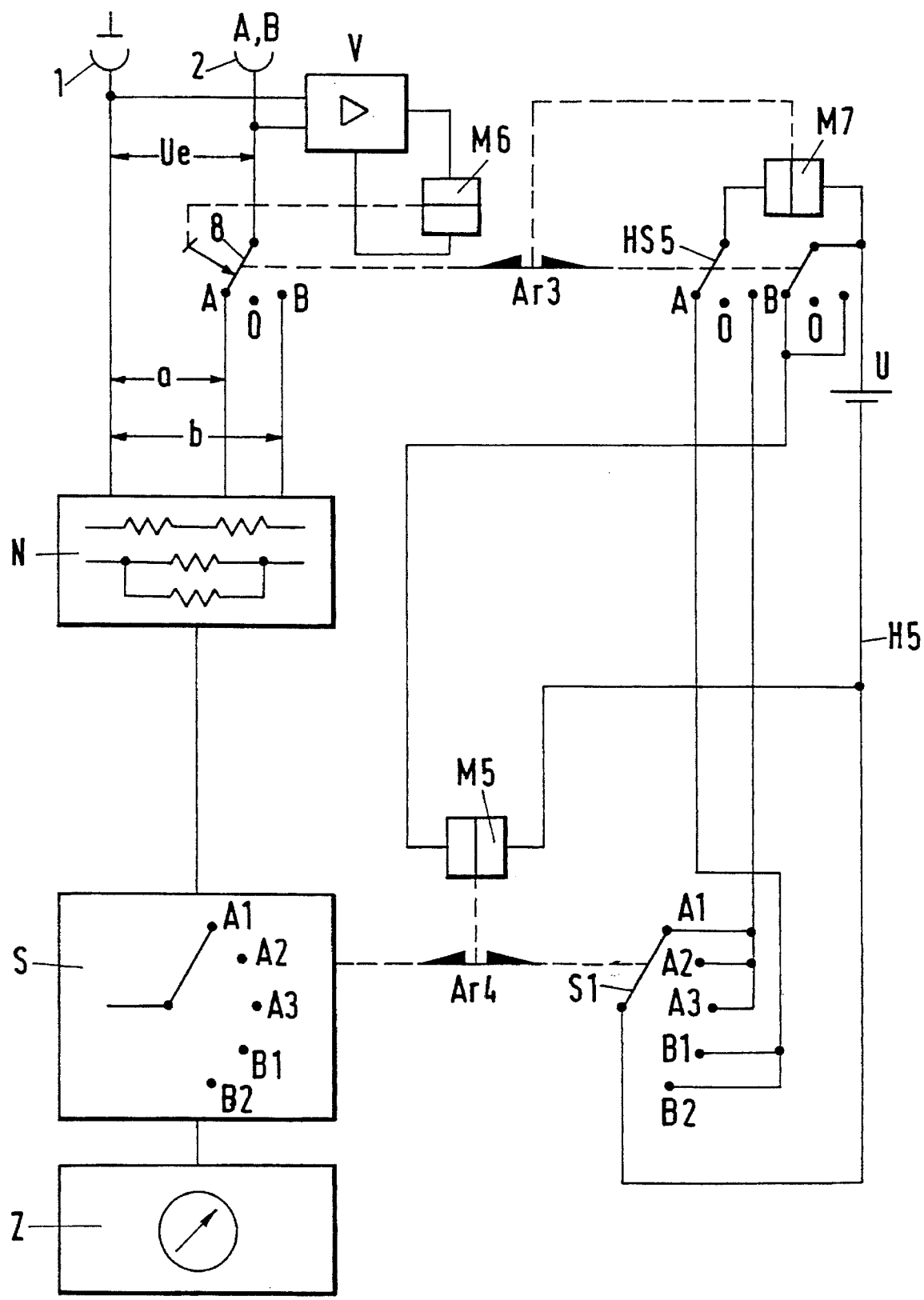
FIG. 2 is a basic schematic and block circuit diagram of a device for blocking certain input circuits in a multimeter having two common input connections.

The circuit of FIG. 2 and the apparatus shown in FIGS. 3 to 6 illustrate electromechanical and purely mechanical devices performing methods for assuring that with two separately operable switches, a first one of which serves as an input circuit switch 8, 9 and a second as the measurement range switch S, a coupling can be provided that assures that the applicable input circuit a, b can be switched on only if its measurable variable matches the measurable variable specified by the measurement range switch S. In this way, even the first part of possible improper uses can be precluded, so that the only check that still needs to be made is whether or not the test signal fits the measurable variable set at the measurement range switch.

Figure 3:
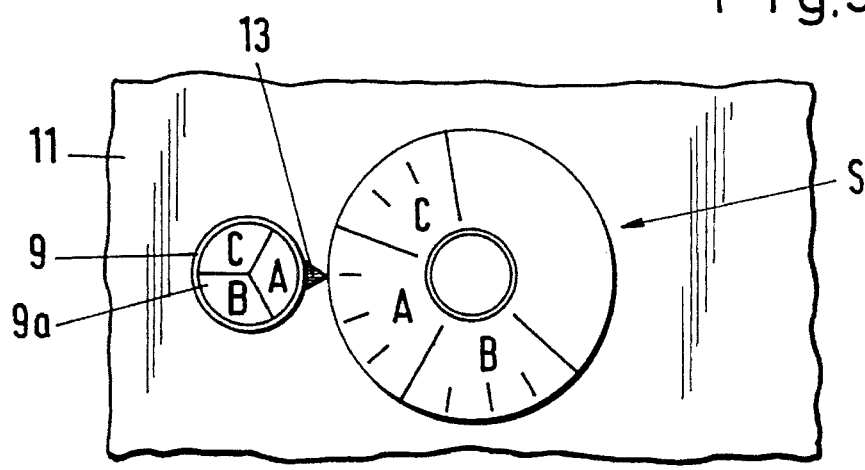
FIG. 3 is a fragmentary, top-plan view of a cover plate of the multimeter showing a measurement range switch and a manually actuated input circuit switch.

The purely mechanical coupling between a measurement range switch S and an the input switch 9 is shown in FIGS. 3 to 6. As FIG. 3 shows, the two switches are disposed in the immediate spatial vicinity of one another, in such a way that a marking for the measurable variables A to C made on their operating knobs can be put into a position corresponding to one another. An arrow 13 applied to a cover plate 11 of the multimeter between the two operating knobs serves as a reference marking. Thus the two operating knobs should be moved into a switch position in which the arrow 13 points to the same measurable variable. In the present example, both switches are set to the measurable variable A. In the case of the measurement range switch S, the three measurable variables A to C have even more measuring ranges associated with them. The coupling between the two switches should work in such a way that the input circuit switch can be switched on only if the arrow 13 of both switches points to the same measurable variable. However, a switchover of the measurement range switch S between different measuring ranges of the same measurable variable A/B or C should still be possible despite any locking.

Figure 4:
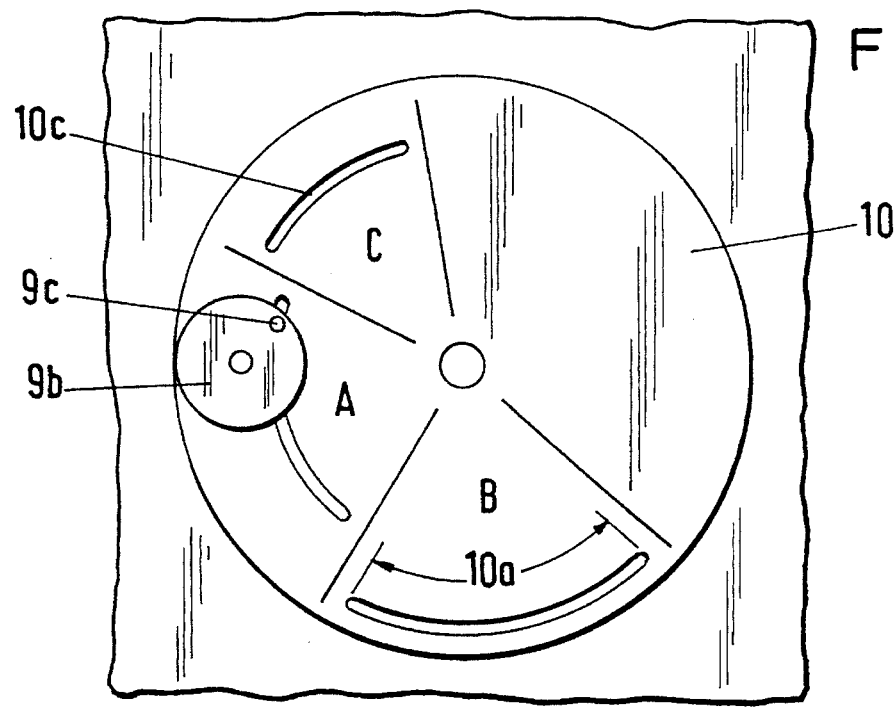
FIG. 4 is a view similar to FIG. 3 showing a mechanical coupling between the measurement range switch and the input circuit switch of FIG. 3.
Figure 5:
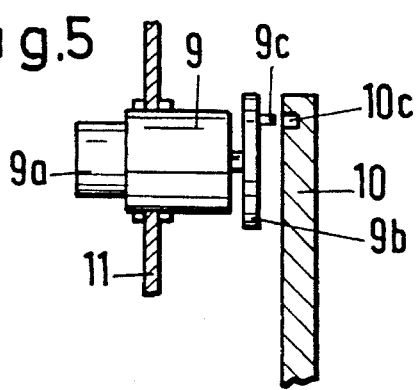
FIG. 5 is a partly sectional, side-elevational view showing the mechanical coupling between the measurement range and input circuit switches, in an uncoupled position.
Figure 6:
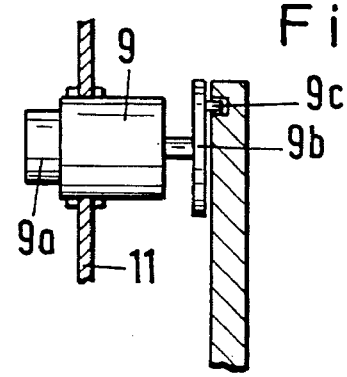
FIG. 6 is a view similar to FIG. 5 showing the mechanical coupling between the measurement range and input circuit switches, in the coupled position.

FIGS. 4 to 6 illustrate one option for providing the coupling. A wheel-like switch element 10 that is part of and is driven by the measurement range switch S, is provided with a diameter which is large enough so that it extends into the range of action of the input circuit switch 9. The input circuit switch 9 is constructed as a turn-and-push switch, which has a turn-and-push element 9a, that first has to be put into a switching position by rotation in which an input circuit of the multimeter is preselected that is suitable for picking up the measurable variable then located at the arrow 13, in this case the measurable variable A. However, switching on the preselected input circuit is brought about only if it is possible to put the turn-and-push element 9a into its actuation position by pressing it. Furthermore, this action is attainable only if a disk-like coupling element 9b which is connected to the turn-and-push element 9a and provided with a first locking element 9c disposed eccentrically secured thereto, can engage a second locking element 10c of the switch element 10, which is constructed as a locking groove.

Due to the eccentric configuration of the first locking element 9c that is constructed as a locking tang, its location with respect to the switch element 10 of the measurement range switch S changes upon each rotation of the turn-and-push element 9a for setting a different measurable variable A to C. The second locking element 10c, which is in the form of locking grooves formed in the switch element 10 of the measurement range switch, are each positioned in such a way that the locking tang 9c can penetrate them only whenever both switches have been set to the same measurable variable A to C. Since the locking is intended merely to prevent a switchover of the measurement range switch between the various measurable variables A to C when the input circuit switch 9 is on, a switchover between different measuring ranges of a measurable variable is possible within the locking range 10a of that measurable variable.

An advantage of the structure described above, with two separate switches, is that the possibly high currents in certain input circuits need not be switched with the aid of the measurement range switch. It is simpler to construct an input circuit switch provided with relatively few contacts in such a way that it can also control high currents. Furthermore, it is not possible to have a risk to the input circuit switch upon switchover, because the current circuit is always interrupted before the switchover. Furthermore, the user is forced to pay greater attention if he or she has to put two switches at a time in the correct position, and in setting the switches he or she would have to make at least two mistakes, namely to set the same incorrect measurable variable for both switches, before an error situation would occur.

The further example of the structure of a protective apparatus of FIG. 2 shows an electric circuit in which the protective function is largely attained by means of electrical or electromechanical components. The mechanical components needed to lock the measurement range switch may match the principle illustrated in FIG. 4, as far as the encoding of the various measuring ranges is concerned.

The multimeter of FIG. 2 has two input circuits a, b having input connections 1 and 2 common to both of them. The different structure of the input circuits a, b will be illustrated with the measuring range network N which may, for instance, include voltage divider resistors for voltage switchover, or shunts for current switchover, and in which the switchover is effected by means of a measurement range switch S. The correspondingly adapted test signal finally reaches a measuring system Z, which serves the purpose of measurement and display.

In order to be able to associate the test signal with the correct measurement circuit a, b, depending on the type of measurable variable A, B to be detected, an input circuit switch 8 is incorporated into the circuit. The input circuit switch 8 can switch from a zero position 0 to a measurable variable A or B and thus to the input circuits a, b.

An auxiliary circuit switch HS5 that is part of or is mechanically coupled to the input circuit switch 8 is likewise switched over from a zero position 0 to a switching position associated with the measurable variable A or B. The auxiliary circuit switch HS5 is located in an auxiliary circuit H5 together with a series-connected magnetic positioner M7, a voltage source U and a switching section S1 of the measurement range switch S.

The measurement range switch S enables a switchover between the measurable variables A and B on one hand, and between various measuring ranges A1, A2, A3 of the measurable variable A and B1, B2 of the measurable variable B on the other hand. The position of the switch segment S1, which depends on the position of the measurement range switch S, is associated with the auxiliary circuit switch HS5 in such a way that the magnetic positioner M7 and a locking device Ar3 depending on it are activated as soon as the auxiliary circuit switch S5 is switched to a different measurable variable from the measurable variable specified by the measurement range switch S. The auxiliary circuit switch HS5 is constructed in such a way that in the switching process it is in the lead, ahead of the input circuit switch 8, and if a switchover to an incorrect measurable variable is made, the locking device Ar3 also becomes operative in such a way that it prevents a switchover of the input circuit switch to an incorrect measurable variable.

In the switching position shown in FIG. 2, the measurable variable A set at the measurement range switch S matches the measurable variable set at the input circuit switch 8. However, if an attempt is made to switch the input circuit switch 8 over to the variable B, then the magnet positioner M7 and thus the locking device Ar3 would be activated by the leading auxiliary circuit switch HS5, in such a way that the input circuit switch 8 would have to be switched back into the zero position 0.

The above-described mode of operation of the circuit assures that after a measurable variable has been specified by the measurement range switch S, it is only possible to switch on the input circuit a, b with which the same measurable variable is associated. However, it should additionally be assured that with the input circuit switch 8 switched on and thus with the input circuit a or b closed, the measurement range switch S cannot be switched over to a different measurable variable. This can be attained with the aid of a second switching path of the auxiliary switching circuit HS5, which has a zero position 0, from which a switch to one of the measurable variables A, B can be made, in the same manner as a first switching path. Another magnet positioner M5 is controlled over this second switching path with the aid of the voltage source U of the auxiliary circuit H5. Through the use of a locking device Ar4, it assures that the measurement range switch S can be switched over only whenever the input circuit switch 8 is in the zero position 0. It is thus impossible for the user of the multimeter to mistakenly switch the measurement range switch S over to another measurable variable while the input circuit switch is on.

Despite the measures taken to increase the safety of use of the multimeter, it remains possible for a measurable variable that is unsuitable for the test signal to be measured, to have been set before the multimeter is put into operation. In order to force the user to check the multimeter setting before connecting a new test object to be measured to it, a further magnet positioner M6 is provided, which monitors the test signal Ue with the aid of an amplifier V, and causes the input circuit switch 8 to be reset to its zero position 0 if the test signal disappears.

No further explanation is needed to appreciate the fact that the input circuit switch 3, 4 of FIG. 1 can be replaced with an input circuit switch of the kind shown in FIGS. 2 to 6, including the coupling elements provided for its for connection with the measurement range switch S. In that case, test signals that are dangerous for the intended input circuits and have been detected by the test circuit PRS would have to cause a blockage of the input circuit switch, so that it cannot turn on the input circuit. An electromechanically actuated shutoff element, which enables the input circuit switch only in the presence of an enable signal, could be used for this purpose.

Resetting of the input circuit switch 9 for a combined turn-and-push actuation can be performed in the same way as with typical pushbutton switches that are unlocked from the activated position the next time they are again pushed in.

I claim:

1. A multimeter for measuring various measurable variables, comprising means for specifying a measurable variable to be picked up, input circuits being connected to said measurable variable specifying means and each being associated with a respective one of the measurable variables for picking up a test signal from a test object, means for testing the test signal as to whether or not a respective one of said input circuits is suitable for picking up the test signal for obtaining an actual measurement; and means for connecting the respective input circuit to the test object for obtaining an actual measurement, if said testing means determine that the respective input circuit is suitable for picking up the test signal.

2. The multimeter according to claim 1, wherein said measurable variable specifying means are a measurement range switch and various input connections.

3. The multimeter according to claim 2, wherein said test signal testing means is for initially checking if the measurable variable specified by said measurement range switch fits said input circuit specified by said input connections, for checking if said specified input circuit is suitable for picking up the applied test signal if it matches, and for only then enabling said input circuit for the applied test signal.

4. The multimeter according to claim 2, wherein said test signal testing means is for initially checking if the measurable variable specified by said measurement range switch fits said input circuit specified by said at least one input circuit switch, for checking if said specified input circuit is suitable for picking up the applied test signal if it matches, and for only then enabling said input circuit for the applied test signal.

5. The multimeter according to claim 1, wherein said measurable variable specifying means are a measurement range switch.

6. The multimeter according to claim 1, wherein said measurable variable specifying means are various input connections.

7. The multimeter according to claim 6, wherein said testing means picks up the test signal immediately downstream of said input connections and remaining connected regardless of which of said input circuits is switched on at a given time.

8. The multimeter according to claim 1, including a measuring system connected to said input circuits for performing a preliminary testing and an actual main measurement of the test signal, said connecting means for connecting various input circuits to said measuring system upon a change from the preliminary testing to the main measurement.

9. The multimeter according to claim 8, wherein said measurable variable specifying means are a measurement range switch, and including a shutoff device coupled to said measurement range switch for enabling contacting of only said input circuit having a measurable variable corresponding to the measurable variable set with said measurement range switch.

10. The multimeter according to claim 9, wherein said shutoff device is electrically and mechanically operable.

11. The multimeter according to claim 9, wherein said shutoff device is electrically operable.

12. The multimeter according to claim 9, wherein said shutoff device is mechanically operable.

13. The multimeter according to claim 1, including an input circuit control device controlling said at least one input circuit switch, and a control circuit connected to said input circuit control device, said input circuit control device being activated as a function of said control circuit, and said control circuit imparting an activation command in accordance with a result of testing a correct one of said input circuits.

14. The multimeter according to claim 13, including at least one magnetic positioner connected between said input circuit control device and said at least one input circuit switch.

15. The multimeter according to claim 1, including an input circuit control device controlling said at least one input circuit switch, a control circuit connected to said input circuit control device, said input circuit control device being activated as a function of said control circuit, and said testing means being connected to said control circuit, said control circuit imparting an activation command in accordance with a result of testing a correct one of said input circuits and of testing the test signal with said testing means.

16. The multimeter according to claim 15, including at least one magnetic positioner connected between said input circuit control device and said at least one input circuit switch.

17. The multimeter according to claim 15, including at least one load resistor bypassing one of said input circuits for ascertaining an internal resistance of the test object at certain measurable variables, and a load circuit switch connected in series with said at least one load resistor, said load circuit switch being controlled by said control circuit for ascertaining an internal resistance with said testing means through a voltage drop method.

18. The multimeter according to claim 17, including a magnetic positioner connected between said load circuit switch and said control circuit.

19. The multimeter according to claim 15, including at least one load resistor bypassing one of said input circuits for ascertaining an internal resistance of the test object at certain measurable variables upon a current measurement, and a load circuit switch connected in series with said at least one load resistor, said load circuit switch being controlled by said control circuit, optionally through a magnetic positioner, for ascertaining an internal resistance with said test circuit through a voltage drop method.

20. The multimeter according to claim 19, including a magnetic positioner connected between said load circuit switch and said control circuit.

21. The multimeter according to claim 15, wherein said measurable variable specifying means are a measurement range switch, and said control circuit locks said measurement range switch against being switched over to a different measurable variable as long as a test signal originating in the test object is detected by said testing means.

22. The multimeter according to claim 21, including a magnet positioner connected between said control circuit and said measurement range switch.

23. The multimeter according to claim 15, wherein said control circuit has at least one microprocessor, and including a manual control element connected to said control circuit for programming or inputting certain instructions.

24. The multimeter according to claim 23, wherein said at least one microprocessor performs further control and computation functions of different types.

25. The multimeter according to claim 23, wherein said at least one microprocessor also performs tasks of said testing means and of said input circuit control unit.

26. The multimeter according to claim 1, including an input circuit control device controlling said at least one input circuit switch, a control circuit connected to said input circuit control device, said input circuit control device being activated as a function of said control circuit, and said testing means being connected to said control circuit, said control circuit imparting an activation command in accordance with a result of testing the test signal with said testing means.

27. The multimeter according to claim 26, including at least one magnetic positioner connected between said input circuit control device and said at least one input circuit switch.

28. The multimeter according to claim 1, including means for generating an error signal apparent to a user if the test signal is not suitable for an intended one of said input circuits, for causing the user to switch over said input circuit.

29. The multimeter according to claim 1, including means for generating an error signal apparent to a user if the test signal is not suitable for an intended one of said input circuits, for causing the user to switch over said input circuit through a mechanically actuatable input circuit switch.

30. The multimeter according to claim 1, including means for automatically switching over said at least one input circuit switch to a suitable input circuit if the test signal is not suitable for an intended one of said input circuits.

31. The multimeter according to claim 1, wherein said connecting means is a turn-on switch and can be actuated both by hand and automatically.

32. The multimeter according to claim 31, wherein said connecting means is multipolar.

33. The multimeter according to claim 31, including magnetic switches for actuating said connecting means.

34. The multimeter according to claim 1, wherein said connecting means is a switchover-type switch and can be actuated both by hand and automatically.

35. The multimeter according to claim 34, wherein said connecting means is multipolar.

36. The multimeter according to claim 34, including magnetic switches for actuating said connecting means.

37. A multimeter for measuring various measurable variables, comprising means for specifying a measurable variable to be picked up, input circuits being connected to said measurable variable specifying means and each being associated with a respective one of the measurable variables for picking up a test signal from a test object, a pair of input terminals for connecting two test leads to said input circuits, said pair of input terminals being suitable for picking up test signals for any of voltage, resistance and current measurements, means for testing the test signal as to whether or not a respective one of said input circuits is suitable for picking up the test signal in an actual measurement and at least one input circuit switch in at least one of said input circuits being open in a position of repose and being switched on for measurement only if a test of the test signal by said testing means has shown that one of said input circuits to be switched on is suitable for picking up the test signal for obtaining an actual measurement.

* * * * *